(12) United States Patent
Shtrom

(10) Patent No.: US 7,639,106 B2
(45) Date of Patent: Dec. 29, 2009

(54) PIN DIODE NETWORK FOR MULTIBAND RF COUPLING

(75) Inventor: Victor Shtrom, Sunnyvale, CA (US)

(73) Assignee: Ruckus Wireless, Inc., Sunnyvale, CA (US)

( * ) Notice: Subject to any disclaimer, the term of this patent is extended or adjusted under 35 U.S.C. 154(b) by 73 days.

(21) Appl. No.: 11/413,670

(22) Filed: Apr. 28, 2006

(65) Prior Publication Data

US 2007/0252666 A1   Nov. 1, 2007

(51) Int. Cl.
*H01P 1/15* (2006.01)
(52) U.S. Cl. .................................. 333/262; 327/503
(58) Field of Classification Search ................. 333/103, 333/262; 327/493, 503, 504
See application file for complete search history.

(56) References Cited

U.S. PATENT DOCUMENTS

| | | | |
|---|---|---|---|
| 723,188 A | 3/1903 | Tesla | |
| 725,605 A | 4/1903 | Tesla | |
| 1,869,659 A | 8/1932 | Broertjes | |
| 2,292,387 A | 8/1942 | Markey et al. | |
| 3,488,445 A | 1/1970 | Chang | |
| 3,568,105 A | 3/1971 | Felsenheld | |
| 3,967,067 A | 6/1976 | Potter | |
| 3,982,214 A | 9/1976 | Burns | |
| 3,991,273 A | 11/1976 | Mathes | |
| 4,001,734 A | 1/1977 | Burns | |
| 4,176,356 A | 11/1979 | Foster et al. | |
| 4,193,077 A | 3/1980 | Greenberg et al. | |
| 4,253,193 A | 2/1981 | Kennard | |
| 4,305,052 A | 12/1981 | Baril et al. | |
| 4,513,412 A | 4/1985 | Cox | |
| 4,554,554 A | 11/1985 | Olsen et al. | |
| 4,733,203 A * | 3/1988 | Ayasli ...................... 333/139 | |
| 4,814,777 A | 3/1989 | Monser | |

(Continued)

FOREIGN PATENT DOCUMENTS

EP      352787 A2      1/1990

(Continued)

OTHER PUBLICATIONS

"Authorization of Spread Spectrum Systems Under Parts 15 and 90 of the FCC Rules and Regulations," Rules and Regulations Federal Communications Commission, 47 CFR Part 2, 15, and 90, Jun. 18, 1985.

(Continued)

*Primary Examiner*—Benny Lee
(74) *Attorney, Agent, or Firm*—Carr & Ferrell LLP

(57) ABSTRACT

A PIN diode network includes a parallel inductor. In the off state of the PIN diode, the inductor forms a resonant tank circuit in parallel with the PIN diode. The inductor is selected based on the stray capacitance of the PIN diode so that the self resonant frequency (SRF) of the tank circuit is at or near the desired operating frequency. At the operating frequency, the impedance of the tank circuit is essentially infinite. At the operating frequency, isolation is improved for the PIN diode network as compared to a PIN diode alone. The PIN diode network allows a lower specification PIN diode to operate with higher isolation. The PIN diode network allows a lower specification PIN diode to operate at a higher frequency than would otherwise be possible due to intrinsic stray capacitance of the PIN diode.

17 Claims, 3 Drawing Sheets

U.S. PATENT DOCUMENTS

| | | |
|---|---|---|
| 5,063,574 A | 11/1991 | Moose |
| 5,097,484 A | 3/1992 | Akaiwa |
| 5,173,711 A | 12/1992 | Takeuchi et al. |
| 5,203,010 A | 4/1993 | Felix |
| 5,208,564 A | 5/1993 | Burns et al. |
| 5,220,340 A | 6/1993 | Shafai |
| 5,282,222 A | 1/1994 | Fattouche et al. |
| 5,291,289 A | 3/1994 | Hulyalkar et al. |
| 5,311,550 A | 5/1994 | Fouche et al. |
| 5,373,548 A | 12/1994 | McCarthy |
| 5,507,035 A | 4/1996 | Bantz |
| 5,532,708 A | 7/1996 | Krenz et al. |
| 5,559,800 A | 9/1996 | Mousseau et al. |
| 5,754,145 A | 5/1998 | Evans |
| 5,767,755 A | 6/1998 | Kim et al. |
| 5,767,809 A | 6/1998 | Chuang et al. |
| 5,786,793 A | 7/1998 | Maeda et al. |
| 5,802,312 A | 9/1998 | Lazaridis et al. |
| 5,964,830 A | 10/1999 | Durrett |
| 5,990,838 A | 11/1999 | Burns et al. |
| 6,011,450 A | 1/2000 | Miya |
| 6,031,503 A | 2/2000 | Preiss, II et al. |
| 6,034,638 A | 3/2000 | Thiel et al. |
| 6,052,093 A | 4/2000 | Yao et al. |
| 6,091,364 A | 7/2000 | Murakami et al. |
| 6,094,177 A | 7/2000 | Yamamoto |
| 6,097,347 A | 8/2000 | Duan et al. |
| 6,104,356 A | 8/2000 | Hikuma et al. |
| 6,169,523 B1 | 1/2001 | Ploussios |
| 6,266,528 B1 | 7/2001 | Farzaneh |
| 6,292,153 B1 | 9/2001 | Aiello et al. |
| 6,307,524 B1 | 10/2001 | Britain |
| 6,317,599 B1 | 11/2001 | Rappaport et al. |
| 6,323,810 B1 | 11/2001 | Poilasne et al. |
| 6,326,922 B1 | 12/2001 | Hegendoerfer |
| 6,337,628 B2 | 1/2002 | Campana, Jr. |
| 6,337,668 B1 | 1/2002 | Ito et al. |
| 6,339,404 B1 | 1/2002 | Johnson et al. |
| 6,345,043 B1 | 2/2002 | Hsu |
| 6,356,242 B1 | 3/2002 | Ploussios |
| 6,356,243 B1 | 3/2002 | Schneider et al. |
| 6,356,905 B1 | 3/2002 | Gershman et al. |
| 6,377,227 B1 | 4/2002 | Zhu et al. |
| 6,392,610 B1 | 5/2002 | Braun et al. |
| 6,404,386 B1 | 6/2002 | Proctor, Jr. et al. |
| 6,407,719 B1 | 6/2002 | Ohira et al. |
| RE37,802 E | 7/2002 | Fattouche et al. |
| 6,414,647 B1 | 7/2002 | Lee |
| 6,424,311 B1 | 7/2002 | Tsai et al. |
| 6,442,507 B1 | 8/2002 | Skidmore et al. |
| 6,445,688 B1 | 9/2002 | Garces et al. |
| 6,456,242 B1 | 9/2002 | Crawford |
| 6,493,679 B1 | 12/2002 | Rappaport et al. |
| 6,496,083 B1 * | 12/2002 | Kushitani et al. ........... 333/103 |
| 6,498,589 B1 | 12/2002 | Horii |
| 6,499,006 B1 | 12/2002 | Rappaport et al. |
| 6,507,321 B2 | 1/2003 | Oberschmidt et al. |
| 6,531,985 B1 | 3/2003 | Jones et al. |
| 6,583,765 B1 | 6/2003 | Schamberger et al. |
| 6,586,786 B2 * | 7/2003 | Tanaka et al. ............... 257/275 |
| 6,611,230 B2 | 8/2003 | Phelan |
| 6,625,454 B1 | 9/2003 | Rappaport et al. |
| 6,633,206 B1 * | 10/2003 | Kato ......................... 333/104 |
| 6,642,889 B1 | 11/2003 | McGrath |
| 6,674,459 B2 | 1/2004 | Ben-Shachar et al. |
| 6,701,522 B1 | 3/2004 | Rubin et al. |
| 6,724,346 B2 | 4/2004 | Le Bolzer |
| 6,725,281 B1 | 4/2004 | Zintel et al. |
| 6,741,219 B2 | 5/2004 | Shor |
| 6,747,605 B2 | 6/2004 | Lebaric |
| 6,753,814 B2 | 6/2004 | Killen et al. |
| 6,762,723 B2 | 7/2004 | Nallo et al. |
| 6,779,004 B1 | 8/2004 | Zintel |
| 6,819,287 B2 | 11/2004 | Sullivan et al. |
| 6,839,038 B2 | 1/2005 | Weinstein |
| 6,859,176 B2 | 2/2005 | Choi |
| 6,859,182 B2 | 2/2005 | Horii |
| 6,876,280 B2 | 4/2005 | Nakano |
| 6,876,836 B2 | 4/2005 | Lin et al. |
| 6,888,504 B2 | 5/2005 | Chiang et al. |
| 6,888,893 B2 | 5/2005 | Li et al. |
| 6,892,230 B1 | 5/2005 | Gu et al. |
| 6,903,686 B2 | 6/2005 | Vance et al. |
| 6,906,678 B2 | 6/2005 | Chen |
| 6,910,068 B2 | 6/2005 | Zintel et al. |
| 6,914,581 B1 | 7/2005 | Popek |
| 6,924,768 B2 | 8/2005 | Wu et al. |
| 6,931,429 B2 | 8/2005 | Gouge et al. |
| 6,941,143 B2 | 9/2005 | Mathur |
| 6,943,749 B2 | 9/2005 | Paun |
| 6,950,019 B2 | 9/2005 | Bellone et al. |
| 6,950,069 B2 | 9/2005 | Gaucher et al. |
| 6,961,028 B2 | 11/2005 | Joy et al. |
| 6,965,353 B2 | 11/2005 | Shirosaka et al. |
| 6,973,622 B1 | 12/2005 | Rappaport et al. |
| 6,975,834 B1 | 12/2005 | Forster |
| 6,980,782 B1 | 12/2005 | Braun et al. |
| 7,023,909 B1 | 4/2006 | Adams et al. |
| 7,034,769 B2 | 4/2006 | Surducan et al. |
| 7,034,770 B2 | 4/2006 | Yang et al. |
| 7,043,277 B1 | 5/2006 | Pfister |
| 7,050,809 B2 | 5/2006 | Lim |
| 7,053,844 B2 | 5/2006 | Gaucher et al. |
| 7,064,717 B2 | 6/2006 | Kaluzni et al. |
| 7,085,814 B1 | 8/2006 | Gandhi et al. |
| 7,088,299 B2 | 8/2006 | Siegler et al. |
| 7,089,307 B2 | 8/2006 | Zintel et al. |
| 7,130,895 B2 | 10/2006 | Zintel et al. |
| 7,171,475 B2 | 1/2007 | Weisman et al. |
| 7,277,063 B2 | 10/2007 | Shirosaka et al. |
| 7,312,762 B2 | 12/2007 | Puente Ballarda et al. |
| 7,319,432 B2 | 1/2008 | Andersson |
| 2001/0046848 A1 | 11/2001 | Kenkel |
| 2002/0031130 A1 | 3/2002 | Tsuchiya et al. |
| 2002/0047800 A1 | 4/2002 | Proctor, Jr. et al. |
| 2002/0080767 A1 | 6/2002 | Lee |
| 2002/0084942 A1 | 7/2002 | Tsai et al. |
| 2002/0101377 A1 | 8/2002 | Crawford |
| 2002/0105471 A1 | 8/2002 | Kojima et al. |
| 2002/0112058 A1 | 8/2002 | Weisman et al. |
| 2002/0158798 A1 | 10/2002 | Chiang et al. |
| 2002/0170064 A1 | 11/2002 | Monroe et al. |
| 2003/0026240 A1 | 2/2003 | Eyuboglu et al. |
| 2003/0030588 A1 | 2/2003 | Kalis et al. |
| 2003/0063591 A1 | 4/2003 | Leung et al. |
| 2003/0122714 A1 | 7/2003 | Wannagot et al. |
| 2003/0169330 A1 | 9/2003 | Ben-Shachar et al. |
| 2003/0184490 A1 | 10/2003 | Raiman et al. |
| 2003/0189514 A1 | 10/2003 | Miyano et al. |
| 2003/0189521 A1 | 10/2003 | Yamamoto et al. |
| 2003/0189523 A1 | 10/2003 | Ojantakanen et al. |
| 2003/0210207 A1 | 11/2003 | Suh et al. |
| 2003/0227414 A1 | 12/2003 | Saliga et al. |
| 2004/0014432 A1 | 1/2004 | Boyle |
| 2004/0017310 A1 | 1/2004 | Runkle et al. |
| 2004/0017860 A1 | 1/2004 | Liu |
| 2004/0027291 A1 | 2/2004 | Zhang et al. |
| 2004/0027304 A1 | 2/2004 | Chiang et al. |
| 2004/0032378 A1 | 2/2004 | Volman et al. |
| 2004/0036651 A1 | 2/2004 | Toda |
| 2004/0036654 A1 | 2/2004 | Hsieh |
| 2004/0041732 A1 | 3/2004 | Aikawa et al. |
| 2004/0048593 A1 | 3/2004 | Sano |
| 2004/0058690 A1 | 3/2004 | Ratzel et al. |

| | | | |
|---|---|---|---|
| 2004/0061653 | A1 | 4/2004 | Webb et al. |
| 2004/0070543 | A1 | 4/2004 | Masaki |
| 2004/0080455 | A1 | 4/2004 | Lee |
| 2004/0095278 | A1 | 5/2004 | Kanemoto et al. |
| 2004/0114535 | A1 | 6/2004 | Hoffmann et al. |
| 2004/0125777 | A1 | 7/2004 | Doyle et al. |
| 2004/0145528 | A1 | 7/2004 | Mukai et al. |
| 2004/0160376 | A1 | 8/2004 | Hornsby et al. |
| 2004/0190477 | A1 | 9/2004 | Olson et al. |
| 2004/0203347 | A1 | 10/2004 | Nguyen |
| 2004/0260800 | A1 | 12/2004 | Gu et al. |
| 2005/0022210 | A1 | 1/2005 | Zintel et al. |
| 2005/0041739 | A1 | 2/2005 | Li et al. |
| 2005/0042988 | A1 | 2/2005 | Hoek et al. |
| 2005/0048934 | A1 | 3/2005 | Rawnick et al. |
| 2005/0074018 | A1 | 4/2005 | Zintel et al. |
| 2005/0097503 | A1 | 5/2005 | Zintel et al. |
| 2005/0128983 | A1 | 6/2005 | Kim et al. |
| 2005/0135480 | A1 | 6/2005 | Li et al. |
| 2005/0138137 | A1 | 6/2005 | Encarnacion et al. |
| 2005/0138193 | A1 | 6/2005 | Encarnacion et al. |
| 2005/0146475 | A1 | 7/2005 | Bettner et al. |
| 2005/0180381 | A1 | 8/2005 | Retzer et al. |
| 2005/0188193 | A1 | 8/2005 | Kuehnel et al. |
| 2005/0240665 | A1 | 10/2005 | Gu et al. |
| 2005/0267935 | A1 | 12/2005 | Gandhi et al. |
| 2006/0094371 | A1 | 5/2006 | Nguyen |
| 2006/0098607 | A1 | 5/2006 | Zeng et al. |
| 2006/0123124 | A1 | 6/2006 | Weisman et al. |
| 2006/0123125 | A1 | 6/2006 | Weisman et al. |
| 2006/0123455 | A1 | 6/2006 | Pai et al. |
| 2006/0168159 | A1 | 7/2006 | Weisman et al. |
| 2006/0184661 | A1 | 8/2006 | Weisman et al. |
| 2006/0184693 | A1 | 8/2006 | Rao et al. |
| 2006/0187660 | A1 | 8/2006 | Liu |
| 2006/0224690 | A1 | 10/2006 | Falkenburg et al. |
| 2006/0225107 | A1 | 10/2006 | Seetharaman et al. |
| 2006/0227761 | A1 | 10/2006 | Scott, III et al. |
| 2006/0239369 | A1 | 10/2006 | Lee |
| 2006/0262015 | A1 | 11/2006 | Thornell-Pers et al. |
| 2006/0291434 | A1 | 12/2006 | Gu et al. |
| 2007/0027622 | A1 | 2/2007 | Cleron et al. |
| 2007/0135167 | A1 | 6/2007 | Liu |

FOREIGN PATENT DOCUMENTS

| | | | |
|---|---|---|---|
| EP | 0 534 612 | | 3/1993 |
| EP | 0756381 | A2 | 1/1997 |
| EP | 1152543 | A1 | 11/2001 |
| EP | 1 376 920 | | 6/2002 |
| EP | 1 315 311 | | 5/2003 |
| EP | 1 450 521 | | 8/2004 |
| EP | 1 608 108 | | 12/2005 |
| JP | 03038933 | | 2/1991 |
| JP | 2008/088633 | | 2/1996 |
| JP | 2001/057560 | | 2/2002 |
| JP | 2005/354249 | | 12/2005 |
| JP | 2006/060408 | | 3/2006 |
| WO | WO 90/04893 | | 5/1990 |
| WO | WO 02/25967 | | 3/2002 |
| WO | WO 03/079484 | | 9/2003 |

OTHER PUBLICATIONS

"Authorization of spread spectrum and other wideband emissions not presently provided for in the FCC Rules and Regulations," Before the Federal Communications Commission, FCC 81-289, 87 F.C.C.2d 876, Jun. 30, 1981.

RL Miller, "4.3 Project X—A True Secrecy System for Speech," Engineering and Science in the Bell System, A History of Engineering and Science in the Bell System National Service in War and Peace (1925-1975), pp. 296-317, 1978, Bell Telephone Laboratories, Inc.

Chang, Robert W., "Synthesis of Band-Limited Orthogonal Signals for Multichannel Data Transmission," the Bell System Technical Journal, Dec. 1966, pp. 1775-1796.

Cimini, Jr., Leonard J, "Analysis and Simulation of a Digital Mobile Channel Using Orthogonal Frequency Division Multiplexing," IEEE Transactions on Communications, vol. Com-33, No. 7, Jul. 1985, pp. 665-675.

Saltzberg, Burton R., "Performance of an Efficient Parallel Data Transmission System," IEEE Transactions on Communication Technology, vol. Com-15, No. 6, Dec. 1967, pp. 805-811.

Weinstein, S. B., et al., "Data Transmission by Frequency-Division Multiplexing Using the Discrete Fourier Transform," IEEE Transactions on Communication Technology, vol. Com-19, No. 5, Oct. 1971, pp. 628-634.

Moose, Paul H., "Differential Modulation and Demodulation of Multi-Frequency Digital Communications Signals," 1990 IEEE,CH2831-6/90/0000-0273.

Casas, Eduardo F., et al., "OFDM for Data Communication Over Mobile Radio FM Channels-Part I: Analysis and Experimental Results," IEEE Transactions on Communications, vol. 39, No. 5, May 1991, pp. 783-793.

Casas, Eduardo F., et al., "OFDM for Data Communication over Mobile Radio FM Channels; Part II: Performance Improvement," Department of Electrical Engineering, University of British Columbia.

Chang, Robert W., et al., "A Theoretical Study of Performance of an Orthogonal Multiplexing Data Transmission Scheme," IEEE Transactions on Communication Technology, vol. Com-16, No. 4, Aug. 1968, pp. 529-540.

Gledhill, J. J., et al., "The Transmission of Digital Television in the UHF Band Using Orthogonal Frequency Division Multiplexing," Sixth International Conference on Digital Processing of Signals in Communications, Sep. 2-6, 1991, pp. 175-180.

Alard, M., et al., "Principles of Modulation and Channel Coding for Digital Broadcasting for Mobile Receivers," 8301 EBU Review Technical, Aug. 1987, No. 224, Brussels, Belgium.

Berenguer, Inaki, et al., "Adaptive MIMO Antenna Selection," Nov. 2003.

Gaur, Sudhanshu, et al., "Transmit/Receive Antenna Selection for MIMO Systems to Improve Error Performance of Linear Receivers," School of ECE, Georgia Institute of Technology, Apr. 4, 2005.

Sadek, Mirette, et al., "Active Antenna Selection in Multiuser MIMO Communications," IEEE Transactions on Signal Processing, vol. 55, No. 4, Apr. 2007, pp. 1498-1510.

Molisch, Andreas F., et al., "MIMO Systems with Antenna Selection-an Overview," Draft, Dec. 31, 2003.

Ken Tang, et al., "MAC Layer Broadcast Support in 802.11 Wireless Networks," Computer Science Department, University of California, Los Angeles, 2000 IEEE, pp. 544-548.

Ken Tang, et al., "MAC Reliable Broadcast in Ad Hoc Networks," Computer Science Department, University of California, Los Angeles, 2001 IEEE, pp. 1008-1013.

Vincent D. Park, et al., "A Performance Comparison of the Temporally-Ordered Routing Algorithm and Ideal Link-State Routing," IEEE, Jul. 1998, pp. 592-598.

Dell Inc., "How Much Broadcast and Multicast Traffic Should I Allow in My Network," PowerConnect Application Note #5, Nov. 2003.

Toskala, Antti, "Enhancement of Broadcast and Introduction of Multicast Capabilities in RAN," Nokia Networks, Palm Springs, California, Mar. 13-16, 2001.

Microsoft Corporation, "IEEE 802.11 Networks and Windows XP," Windows Hardware Developer Central, Dec. 4, 2001.

Festag, Andreas, "What is MOMBASA?" Telecommunication Networks Group (TKN), Technical University of Berlin, Mar. 7, 2002.

Hewlett Packard, "HP ProCurve Networking: Enterprise Wireless LAN Networking and Mobility Solutions," 2003.

Dutta, Ashutosh et al., "MarconiNet Supporting Streaming Media Over Localized Wireless Multicast," Proc. of the 2d Int'l Workshop on Mobile Commerce, 2002.

Dunkels, Adam et al., "Making TCP/IP Viable for Wireless Sensor Networks," Proc. of the 1st Euro. Workshop on Wireless Sensor Networks, Berlin, Jan. 2004.

Dunkels, Adam et al., "Connecting Wireless Sensornets with TCP/IP Networks," Proc. of the 2d Int'l Conf. on Wired Networks, Frankfurt, Feb. 2004.

Cisco Systems, "Cisco Aironet Access Point Software Configuration Guide: Configuring Filters and Quality of Service," Aug. 2003.

Hirayama, Koji et al., "Next-Generation Mobile-Access IP Network," Hitachi Review vol. 49, No. 4, 2000.

Pat Calhoun et al., "802.11r strengthens wireless voice," Technology Update, Network World, Aug. 22, 2005, http://www.networkworld.com/news/tech/2005/082208techupdate.html.

Areg Alimian et al., "Analysis of Roaming Techniques," doc.:IEEE 802.11-04/0377r1, Submission, Mar. 2004.

Information Society Technologies Ultrawaves, "System Concept / Architecture Design and Communication Stack Requirement Document," Feb. 23, 2004.

Golmie, Nada, "Coexistence in Wireless Networks: Challenges and System-Level Solutions in the Unlicensed Bands," Cambridge University Press, 2006.

Mawa, Rakesh, "Power Control in 3G Systems," Hughes Systique Corporation, Jun. 28, 2006.

Wennstrom, Mattias et al., "Transmit Antenna Diversity in Ricean Fading MIMO Channels with Co-Channel Interference," 2001.

Steger, Christopher et al., "Performance of IEEE 802.11b Wireless LAN in an Emulated Mobile Channel," 2003.

Chang, Nicholas B. et al., "Optimal Channel Probing and Transmission Scheduling for Opportunistics Spectrum Access," Sep. 2007.

Chuang et al., A 2.4 GHz Polarization-diversity Planar Printed Dipole Antenna for WLAN and Wireless Communication Applications, Microwave Journal, vol. 45, No. 6, pp. 50-62 (Jun. 2002).

Frederick et al., Smart Antennas Based on Spatial Multiplexing of Local Elements (SMILE) for Mutual Coupling Reduction, IEEE Transactions of Antennas and Propogation, vol. 52., No. 1, pp. 106-114 (Jan. 2004).

W.E. Doherty, Jr. et al., The Pin Diode Circuit Designer's Handbook (1998).

Varnes et al., A Switched Radial Divider for an L-Band Mobile Satellite Antenna, European Microwave Conference (Oct. 1995), pp. 1037-1041.

English Translation of PCT Pub. No. WO2004/051798 (as filed U.S. Appl. No. 10/536,547).

Behdad et al., Slot Antenna Miniaturization Using Distributed Inductive Loading, Antenna and Propagation Society International Symposium, 2003 IEEE, vol. 1, pp. 308-311 (Jun. 2003).

Press Release, NETGEAR RangeMax(TM) Wireless Networking Solutions Incorporate Smart MIMO Technology To Eliminate Wireless Dead Spots and Take Consumers Farther, Ruckus Wireles Inc. (Mar. 7, 2005), available at http://ruckuswireless.com/press/releases/20050307.php.

Tsunekawa, Kouichi, "Diversity Antennas for Portable Telephones," 39th IEEE Vehicular Technology Conference, pp. 50-56, vol. I, Gateway to New Concepts in Vehicular Technology, May 1-3, 1989, San Francisco, CA.

Supplementary European Search Report for foreign application No. EP07755519 dated Mar. 11, 2009.

Ando et al., "Study of Dual-Polarized Omni-Directional Antennas for 5.2 GHz-Band 2×2 MIMO-OFDM Systems," Antennas and Propogation Society International Symposium, 2004, IEEE, pp. 1740-1743 vol. 2.

Bedell, Paul, "Wireless Crash Course," 2005, p. 84, The McGraw-Hill Companies, Inc., USA.

Petition Decision Denying Request to Order Additional Claims for U.S. Patent No. 7,193,562 (U.S. Appl. No. 95/001,078) mailed on Jul. 10, 2009.

Right of Appeal Notice for U.S. Patent No. 7,193,562 (U.S. Appl. No. 95/001,078) mailed on Jul. 10, 2009.

* cited by examiner

PIN DIODE NETWORK FOR MULTIBAND RF COUPLING

BACKGROUND OF INVENTION

1. Field of the Invention

The present invention relates generally to radio frequency (RF) networks, and more particularly to a PIN diode network for multiband RF coupling.

2. Description of the Prior Art

PIN diodes are commonly used for RF switching. The PIN diode is a semiconductor device with heavily doped p-type and n-type regions separated by an intrinsic region. When forward biased or "on," the PIN diode behaves as a variable resistor. When a PIN diode is zero or reverse biased (off, the PIN diode appears as a parallel plate capacitor, with "stray" capacitance essentially independent of bias voltage.

PIN diodes are available in a variety of form factors and performance attributes. Generally, one performance attribute that drives cost of the PIN diode is stray capacitance. At a given operating frequency, a PIN diode with relatively lower stray capacitance is typically more expensive than a PIN diode with higher stray capacitance.

A limitation with PIN diodes in RF switching applications is reduced isolation due to the stray capacitance of the PIN diode when at zero or reverse bias.

SUMMARY OF THE INVENTION

A PIN diode network comprises an input port, an output port, a PIN diode, a first inductor, and a second inductor. The PIN diode is configured to selectively couple the input port to the output port by application of a forward bias to the PIN diode. The PIN diode has stray capacitance in an off state upon removal of the forward bias. The first inductor is in parallel with the PIN diode and configured to self-resonate at a first operating frequency of the PIN diode network with the stray capacitance of the PIN diode when the PIN diode is in the off state. The second inductor is in parallel with the PIN diode and configured to self-resonate at a second operating frequency of the PIN diode network with the stray capacitance of the PIN diode, when the PIN diode is in the off state.

The PIN diode network may have improved isolation between the input port and the output port at the first operating frequency as compared to an isolation of the PIN diode alone between the input port and the output port. The first inductor in parallel with the PIN diode may be configured to form an equivalent tank circuit at the first operating frequency.

In one aspect, a method comprises receiving into an input port a first frequency and a second frequency, the input port selectively coupled to an output port by a PIN diode. If the PIN diode is forward biased, the method includes coupling the first frequency and the second frequency to the output port, otherwise, the method includes blocking the first frequency by self resonance of a first inductor and a stray capacitance of the PIN diode and blocking the second frequency by self resonance of a second inductor and the stray capacitance of the PIN diode. Blocking the first frequency by self resonance may comprise forming an equivalent tank circuit of the first inductor and the PIN diode.

BRIEF DESCRIPTION OF DRAWINGS

The present invention will now be described with reference to drawings that represent a preferred embodiment of the invention. In the drawings, like components have the same reference numerals. The illustrated embodiment is intended to illustrate, but not to limit the invention. The drawings include the following figures.

DETAILED DESCRIPTION

Figure 1A:
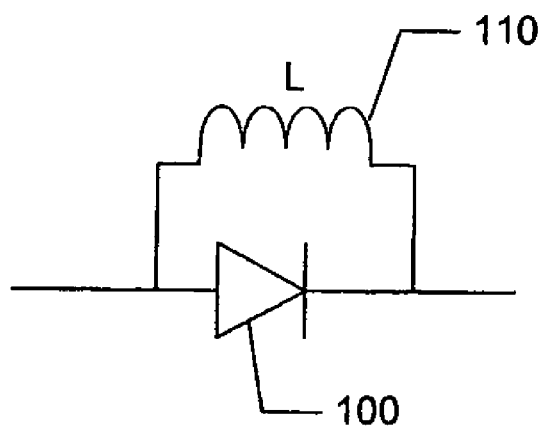
FIG. 1A illustrates a simplified architecture for improving the isolation of a PIN diode, in one embodiment in accordance with the present invention.
Figure 1B:
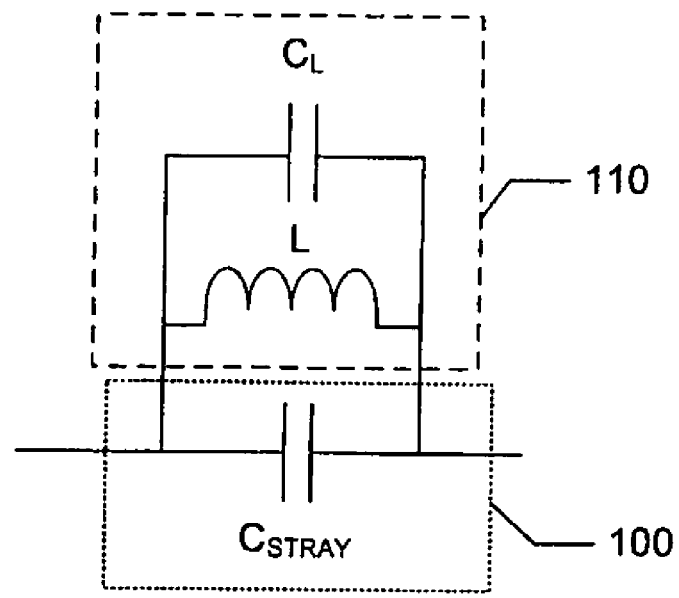
FIG. 1B illustrates an equivalent circuit for the simplified circuit architecture of FIG. 1A when the PIN diode is off (zero or reverse biased), in one embodiment in accordance with the present invention.

FIG. 1A illustrates a simplified circuit architecture for improving the isolation of a PIN diode 100, in one embodiment in accordance with the present invention. Generally, an inductor L 110 is placed in parallel with the PIN diode 100 and selected so that the inductor L 110 adds to the stray capacitance of the PIN diode 100, as described further herein. FIG. 1B illustrates an equivalent circuit for the simplified circuit architecture of FIG. 1A when the PIN diode 100 is "off" (i.e., zero or reverse biased), in one embodiment in accordance with the present invention. The inductor L 110 has an equivalent stray capacitance $C_L$. The PIN diode 100 has stray capacitance of $C_{STRAY}$ when it is off.

The inductor L 110 in parallel with the capacitors $C_L$ and $C_{STRAY}$ forms a resonant tank circuit. The stray capacitance $C_L$ of the parallel inductor L 110 is selected so that, in parallel with the stray capacitance $C_{STRAY}$ of the PIN diode 100, the self-resonant frequency (SRF) of the equivalent resonant tank circuit is at the desired operating frequency of the PIN diode 100. The SRF for an ideal tank circuit including the parallel inductor L110 and the PIN diode 100 may be computed as:

$$f = \frac{1}{2\pi\sqrt{L(C_L + C_{STRAY})}}.$$

At the SRF, the impedance of the equivalent resonant tank circuit is essentially infinite. Therefore, at the SRF the inductance and stray capacitance of the inductor L 110 counteracts the stray capacitance of the PIN diode 100 that would otherwise reduce isolation of the PIN diode 100. The resulting self-resonance of the equivalent resonant tank circuit, by having the inductor L 110 in parallel with the PIN diode 100, essentially makes the PIN diode 100 operate in a more ideal fashion.

For example in one embodiment, the PIN diode 100 is to operate in a frequency range of about 2.4 to 2.4835 GHz. The PIN diode 100 has stray capacitance of about 0.17 pF when in the off state. With an inductance value of the inductor L 110 of 25 nH, the SRF of the equivalent circuit is about 2.44 GHz. Therefore, at 2.44 GHz with the PIN diode 100 biased off, the impedance of the equivalent resonant tank circuit is essentially infinite, yielding improved isolation with the PIN diode 100.

Figure 2:
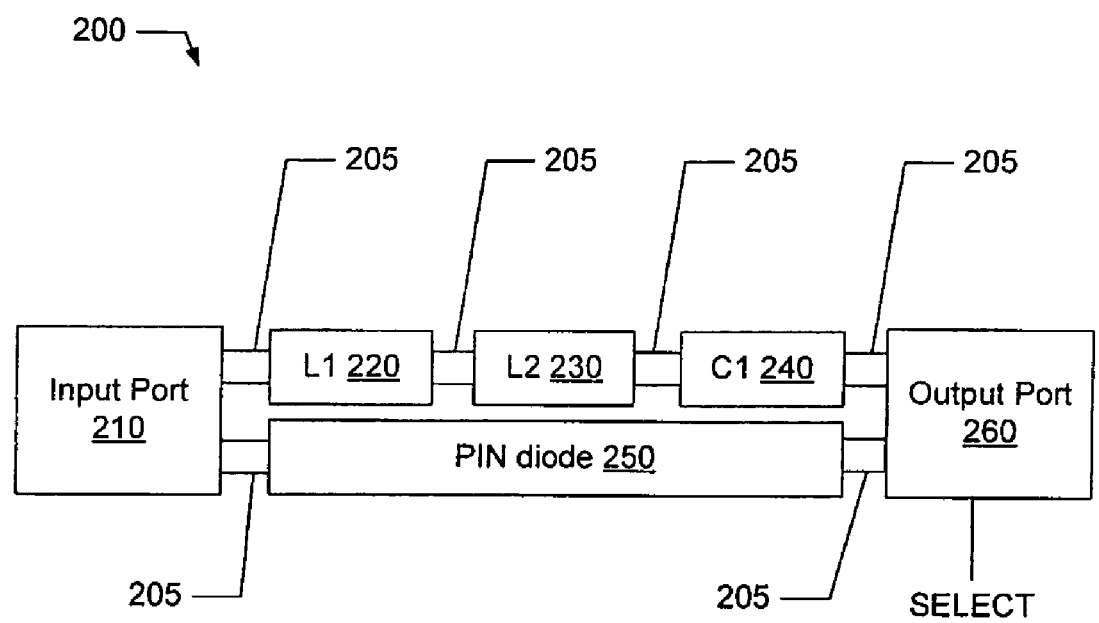
FIG. 2 illustrates a partial layout on a printed circuit board (PCB) for a multiband coupling network, in one embodiment in accordance with the present invention.

FIG. 2 illustrates a partial layout on a printed circuit board (PCB) for a multiband coupling network 200, in one embodiment in accordance with the present invention. The multiband coupling network 200 includes, soldered to corresponding solder pads 205 between an input port 210 and an output port 260, a first inductor L1 220 in series with a second inductor L2 230 and a (e.g., 10 pF) DC blocking capacitor C1 240. In parallel with the inductors L1 220, L2 230 and capacitor C1 240, a PIN diode 250 is soldered to corresponding solder pads 205. A SELECT signal (e.g., DC bias voltage) applied to the output port 260 is used to turn on/off the PIN diode 250.

The inductor L1 220 is selected such that, as described above with respect to FIG. 1, the inductor L1 220 and its stray capacitance in parallel with the stray capacitance of the PIN diode 250 yield an SRF for "low band" RF, for example within the range of about 2.4 to 2.4835 GHz. The inductor L2 230 is selected such that the inductor L2 230 and its stray capacitance in parallel with the stray capacitance of the PIN diode 250 yield an SRF for "high band" RF, for example within the range of about 4.9 to 5.835 GHz. The DC blocking capacitor 240 is of such large value to have negligible effect on the SRF for low band or the SRF for high band.

When the SELECT signal is biased low with respect to the input port 210, the PIN diode 250 is forward biased or turned on, and the input port 210 is coupled to the output port 260. Essentially, the PIN diode 250 shorts across the inductors L1 220, L2 230 and capacitor 240, such that the components in parallel with the PIN diode 250 have negligible effect.

With the SELECT signal floating or biased high, however, the PIN diode 250 is zero or reversed biased (off). For low band RF at the input port 210, the inductor L1 220 in parallel with the stray capacitance of the PIN diode 250 forms a "band stop filter" or notch filter tuned at the low band. Therefore, the low band RF at the input port 210 is isolated from the output port 260 by high impedance. Similarly, for high band RF at the input port 210, the inductor L2 230 in parallel with the stray capacitance of the PIN diode 250 forms a band stop or notch filter tuned at the high band. The high band RF at the input port 210 is isolated from the output port 260 by high impedance.

Figure 3:
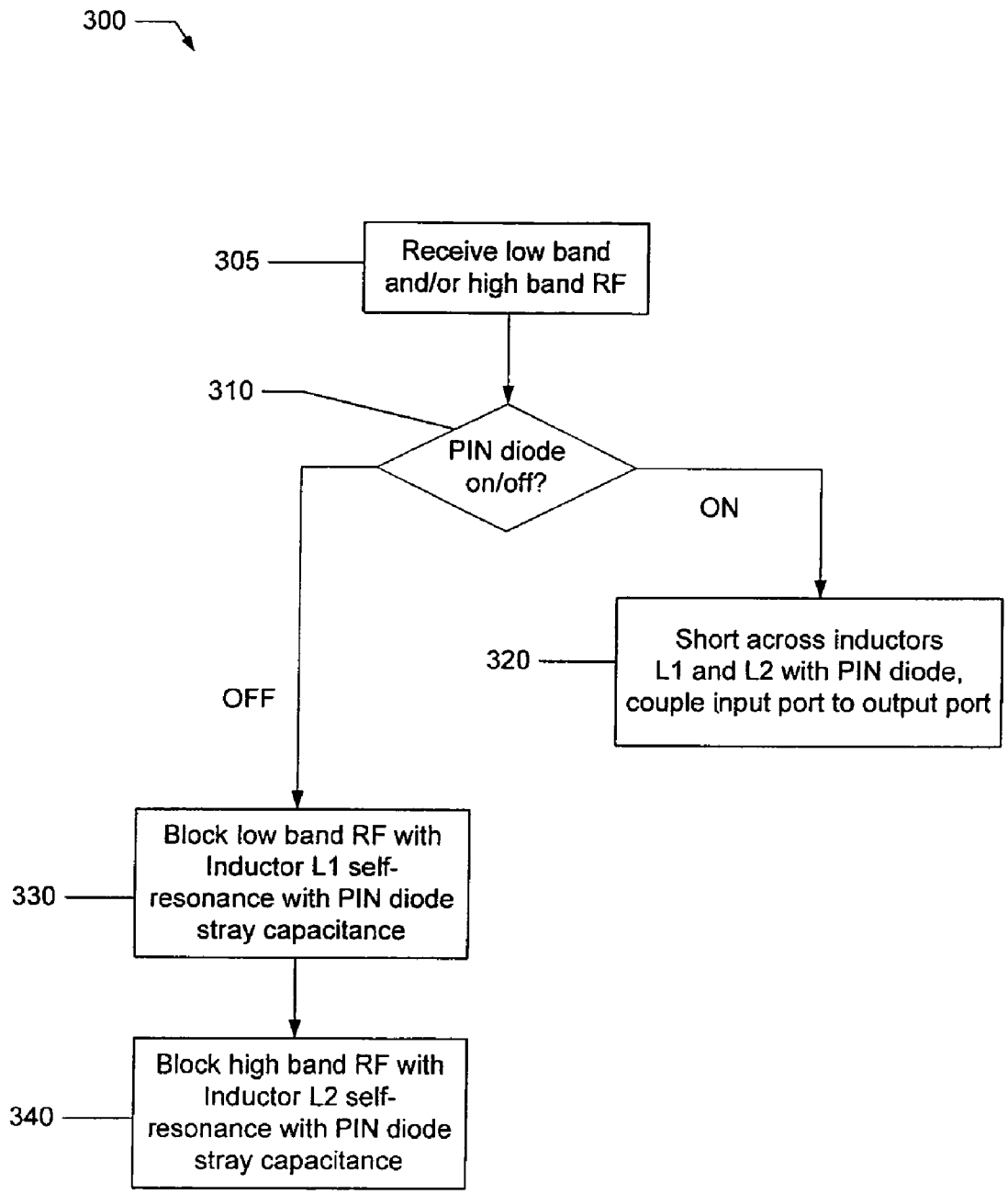
FIG. 3 illustrates a method of operation of the multiband coupling network of FIG. 2, in one embodiment in accordance with the present invention.

FIG. 3 illustrates a method 300 of operation of the multiband coupling network 200 of FIG. 2, in one embodiment in accordance with the present invention. At step 305, the input port 210 receives low band and/or high band RF. At step 320, if the PIN diode 250 is on at step 310, the PIN diode 250 shorts across the inductors L1 220, L2 230 and capacitor 240 and couples the input port 210 to the output port 260. Alternatively, if the PIN diode 250 is off at step 310, then at step 330 the inductor L1 220 self-resonates with the stray capacitance of the PIN diode 250 to form a band-stop filter that blocks low band RF from propagating to the output port 260. Further, for high band RF, at step 340 the inductor L2 230 self-resonates with the stray capacitance of the PIN diode 250 to form a band-stop filter and high band RF from propagating to the output port 260.

Therefore, an advantage of the multiband coupling network 200 of FIG. 2 is that, because of the equivalent resonant tank circuits (band-stop or notch filters) formed by the inductors L1 220 and L2 230 in parallel with the stray capacitance of the PIN diode 250, isolation is improved between the input port 210 and the output port 260 for both low band and high band. This yields higher isolation for a given PIN diode 250. In other words, a relatively inexpensive PIN diode 250 that has relatively high stray capacitance and intrinsically poor isolation may be used in the multiband coupling network 200, and the equivalent resonant tank circuits improve the isolation of the PIN diode 250 at low band and high band.

A further advantage of the multiband coupling network 200 is that for a given PIN diode 250, the multiband coupling network 200 can be used at a higher frequency. For example, at 10 GHz, PIN diodes typically are not used currently because of their stray capacitance. Alternatively at such high frequencies, expensive high quality PIN diodes are required. By accounting for the stray capacitance of the PIN diode with parallel inductance tuned to form a band-stop or notch filter at the desired frequency of operation of the PIN diode (or series band-stop filters for multiple frequency bands), the multiband coupling network 200 allows a PIN diode to be used in a switching network at higher frequencies than currently possible. Further, the inductors L1 220, L2 230 and capacitor 240 are incredibly inexpensive parts, much less expensive than a higher-performance PIN diode 250.

Although shown in FIG. 2 as in-line, the inductors L1 220, L2 230 and capacitor 240 do not need to be directly in-line. In some embodiments, for example where the components in parallel with the PIN diode 250 are not physically about ⅓ the size of the PIN diode 250, the inductors L1 220, L2 230 and capacitor 240 are arranged in a triangular orientation to approximately match the physical size of the PIN diode 250. Such orientation prevents creating "stubs" at the operating frequency of the multiband coupling network 200.

The invention has been described herein in terms of several preferred embodiments. Other embodiments of the invention, including alternatives, modifications, permutations and equivalents of the embodiments described herein, will be apparent to those skilled in the art from consideration of the specification, study of the drawings, and practice of the invention. The embodiments and preferred features described above should be considered exemplary, with the invention being defined by the appended claims, which therefore include all such alternatives, modifications, permutations and equivalents as fall within the true spirit and scope of the present invention.

What is claimed is:

1. A PIN diode network, comprising:
   an input port;
   an output port;
   a PIN diode configured to selectively couple the input port to the output port by application of a forward bias to the PIN diode, the PIN diode having a stray capacitance in an off state upon removal of the forward bias;
   a series circuit having a first inductor and a second inductor connected in series, the series circuit connected in parallel with the PIN diode, the first inductor configured to self-resonate at a first operating frequency of the PIN diode network with the stray capacitance of the PIN diode when the PIN diode is in the off state, the self resonance at the first operating frequency obtained by only the first inductor with the stray capacitance of the PIN diode;
   the second inductor configured to self-resonate at a second operating frequency of the PIN diode network with the stray capacitance of the PIN diode when the PIN diode is in the off state, the self resonance at the second operating frequency obtained by only the second inductor with the stray capacitance of the PIN diode.

2. The PIN diode network of claim 1 wherein the PIN diode network has increased isolation between the input port and the output port at the first operating frequency as compared to an isolation of the PIN diode alone between the input port and the output port.

3. The PIN diode network of claim 1 wherein the first operating frequency is in the range of about 2.4 to 2.4835 GHz.

4. The PIN diode network of claim 1 wherein the second operating frequency is in the range of about 4.9 to 5.835 GHz.

5. The PIN diode network of claim 1 wherein the first operating frequency of the PIN diode network is determined based on the equation:

$$f = \frac{1}{2\pi\sqrt{L(C_L + C_{STRAY})}},$$

where L is the value of the first inductor, $C_L$ is the stray capacitance of the first inductor, and $C_{STRAY}$ is the stray capacitance of the PIN diode.

6. The PIN diode network of claim 1 wherein the first inductor includes a stray capacitance that counteracts the stray capacitance of the PIN diode.

7. The PIN diode network of claim 1 wherein the first inductor in parallel with the PIN diode forms a resonant tank circuit at the first operating frequency.

8. The PIN diode network of claim 1 wherein the first inductor in parallel with the PIN diode are configured to provide a band-stop filter at the first operating frequency.

9. A method, comprising:
receiving into an input port a first frequency and a second frequency, the input port selectively coupled to an output port by a PIN diode;
coupling the first frequency and the second frequency to the output port when the PIN diode is forward biased; and
blocking the first frequency by self resonance of only a first inductor and a stray capacitance of the PIN diode and blocking the second frequency by self resonance of only a second inductor and the stray capacitance of the PIN diode when the PIN diode is not forward biased, the first inductor and the second inductor comprising a series circuit connected in parallel with the PIN diode.

10. The method of claim 9 wherein a stray capacitance of the first inductor counteracts with the stray capacitance of the PIN diode.

11. The method of claim 9 wherein the first inductor is in series with the second inductor, the first inductor and the second inductor in parallel with the PIN diode.

12. The method of claim 9 wherein the first frequency is determined based on the equation:

$$f = \frac{1}{2\pi\sqrt{L(C_L + C_{STRAY})}},$$

where L is an inductance value of the first inductor, $C_L$ is a stray capacitance of the first inductor, and $C_{STRAY}$ is the stray capacitance of the PIN diode.

13. The method of claim 9 wherein blocking the first frequency by self resonance comprises forming a resonant tank circuit at the frequency of the first inductor and the PIN diode.

14. A system for multiband RF coupling, comprising:
an input port for receiving a first frequency and a second frequency;
an output port; and
means for selectively isolating the first frequency and the second frequency from the output port, including a first means including a first inductor for isolating the first frequency in series with a second means for isolating the second frequency, the first inductor having a stray capacitance that counteracts a stray capacitance of a PIN diode.

15. A system for multiband RF coupling, comprising:
an input port for receiving a first frequency and a second frequency;
an output port; and
means for selectively isolating the first frequency and the second frequency from the output port, wherein the means for selectively isolating the first frequency and the second frequency comprises a first inductor and a second inductor electrically connected in series and a PIN diode between the input port and the output port, and the isolation of the means for selectively isolating is greater than an isolation of the PIN diode by itself between the input port and the output port.

16. A system for multiband RF coupling, comprising:
an input port for receiving a first frequency and a second frequency;
an output port; and
means for selectively isolating the first frequency and the second frequency from the output port including a first means for isolating the first frequency, wherein the first means comprises an inductor in parallel with a PIN diode, the inductor having a stray capacitance that counteracts a stray capacitance of the PIN diode, the inductor and the PIN diode configured to resonate at the first frequency when the PIN diode is in an off state.

17. A system for multiband RF coupling, comprising:
an input port for receiving a first frequency and a second frequency;
an output port; and
means for selectively isolating the first frequency and the second frequency from the output port including a:
first means for isolating the first frequency, and
a second means for isolating the second frequency, wherein the first means comprises a first inductor and the second means comprises a second inductor, and wherein the first inductor and the second inductor are electrically connected in series and the first inductor and the second inductor are in parallel with the PIN diode, only the first inductor and the PIN diode are configured to resonate at the first frequency when the PIN diode is in an off state and only the second inductor and the PIN diode are configured to resonate at the second frequency when the PIN diode is in an off state.

* * * * *